(12) United States Patent
Takahashi

(10) Patent No.: US 6,927,537 B2
(45) Date of Patent: Aug. 9, 2005

(54) ORGANIC ELECTROLUMINESCENCE DEVICE

(75) Inventor: Akira Takahashi, Yokohama (JP)

(73) Assignee: Optrex Corporation, Tokyo (JP)

( * ) Notice: Subject to any disclaimer, the term of this patent is extended or adjusted under 35 U.S.C. 154(b) by 0 days.

(21) Appl. No.: 10/745,479

(22) Filed: Dec. 29, 2003

(65) Prior Publication Data

US 2004/0191565 A1 Sep. 30, 2004

(30) Foreign Application Priority Data

Dec. 26, 2002 (JP) .................................... 2002-376280

(51) Int. Cl.$^7$ ............................ H01J 1/62; H01J 63/04; B32B 19/00
(52) U.S. Cl. ........................................ 313/504; 428/690
(58) Field of Search .............................. 428/212, 690, 428/917; 257/40; 313/502, 503, 504–506

(56) References Cited

U.S. PATENT DOCUMENTS

| | | | | |
|---|---|---|---|---|
| 5,281,489 A | * | 1/1994 | Mori et al. | 428/690 |
| 5,601,903 A | * | 2/1997 | Fujii et al. | 428/690 |
| 5,652,067 A | * | 7/1997 | Ito et al. | 428/690 |
| 5,834,894 A | * | 11/1998 | Shirasaki et al. | 313/509 |
| 6,630,253 B1 | * | 10/2003 | Tanaka et al. | 428/690 |

FOREIGN PATENT DOCUMENTS

| | | |
|---|---|---|
| JP | 9-134786 | 5/1997 |
| JP | 2000-106277 | 4/2000 |
| JP | 2002-38140 | 2/2002 |

OTHER PUBLICATIONS

J. Kido, et al., Applied physics letters, vol. 61, No. 7, pp. 761–763, "Organic Electroluminescent Devices Based on Molecularly Doped Polymers", Jul.–Dec. 1992.

* cited by examiner

*Primary Examiner*—Joseph Williams
*Assistant Examiner*—Peter Macchiarolo
(74) *Attorney, Agent, or Firm*—Oblon, Spivak, McClelland, Maier & Neustadt, P.C.

(57) ABSTRACT

An organic electroluminescence device comprising an anode layer, a cathode layer, a light-emitting layer present between the anode layer and the cathode layer, and a hole transporting thin film layer present between the light-emitting layer and the anode layer, wherein the hole transporting thin film layer in contact with the anode layer, contains at least 5 mass % of a polymer compound, and the value of the lowest unoccupied molecular orbit of the thin film layer is at least 2.1 eV.

13 Claims, 1 Drawing Sheet

ORGANIC ELECTROLUMINESCENCE DEVICE

BACKGROUND OF THE INVENTION

1. Field of the Invention

The present invention relates to an organic electroluminescence device (hereinafter sometimes referred to also as an organic EL device) having improved emission characteristics and lifetime characteristics.

2. Discussion of Background

Along with the rapid progress in the technical developments in the information communication field in recent years, more expectations are placed on flat display devices as substitutes for CRT. Among them, an organic EL device is excellent in the high speed response, visibility, luminance, etc., and various studies are being made thereon.

In an organic EL device, electron holes are injected from an anode, and electrons are injected from a cathode, whereby they will be recombined in a light-emitting layer to form excitons. Their energy will be transferred to a light-emitting material to emit light. In a case where the light-emitting layer is constituted by a host compound and a guest compound which is a light-emitting dye, excitons will be formed in the host compound, and they will be transferred to the guest compound, whereupon luminescence of the light-emitting dye can be obtained. With respect to such a combination of a host compound and a guest compound, various combinations of dyes are known for high fluorescent quantum yields or high phosphorescent quantum yields.

With respect to an organic EL device, it is known that the luminance is likely to decrease as the emission time passes. Accordingly, it is important to suppress such a luminance decreasing rate and to improve the lifetime of the device. Further, the organic EL device is usually a device constituted by thin layers, whereby short circuiting between the anode layer and the cathode layer, or a leakage current, is likely to bring about a display defect or shortening of the lifetime.

As a method for improving the lifetime of a device, studies have been made on a method of using a material having high heat resistance for the hole transport layer or a method of doping a light-emitting dye having a long lifetime (such as rubrene) as a guest compound to the light-emitting layer. Further, a method has also been developed in which a plurality of guest compounds are incorporated in a host compound in a light-emitting layer to attain high luminous efficiency or to prolong the lifetime (JP-A-9-134786, JP-A-2000-106277 and JP-A-2002-38140). However, among devices having high luminous efficiency, there are some, of which the half luminance lifetime is short, or some whereby the voltage increase is large during constant current driving.

Further, as a method for suppressing short circuiting, it is known to employ a polymer compound on the surface of the anode layer (J. Kido, Appl. Phys. Lett., 761 (1992)). However, even by using this method, no adequate extension of the lifetime can be attained, and a substantial improvement is still desired.

One of the causes for the large increase of the voltage and the quick decrease of the luminance, is considered to be accumulation of a carrier on the host compound in the light-emitting layer and the low heat resistance of the light-emitting layer. For example, in a case where aluminum tris(8-quinolinolate) (hereinafter referred to as Alq) is used as the host compound in a light-emitting layer, Alq has an electron transporting property which is superior to the hole transporting property (electron mobility: $5.0 \times 10^{-5}$ cm$^2$/Vs, hole mobility: $8.0 \times 10^{-8}$ cm$^2$/Vs), whereby an injected hole is likely to be retained on one Alq molecule, which leads to degradation of the host compound. This is considered to be a cause for the increase of the driving voltage or the decrease of the luminance.

The above-mentioned degradation of the host compound is not limited to Alq, and similar degradation tends to occur with other host compounds and is considered to be a cause for an increase of the driving voltage or for a decrease of the luminance. Accordingly, it is considered possible to improve the half luminance lifetime and to suppress the increase of the driving voltage, by suppressing retention and accumulation of the carrier which causes degradation of the host compound.

Further, the reason as to why the conventional method of suppressing short circuiting or leakage current by forming a thin film layer of a polymer compound on the surface of the anode layer, did not sufficiently contribute to prolongation of the lifetime of the device, is considered to be such that no adequate consideration is given to the injection or transporting characteristics of the carrier in the after-mentioned hole transport layer or the anode interface layer. In an organic EL device, a hole transport layer is formed between the anode layer and the light-emitting layer in many cases. Further, a thin film layer so-called an anode interface layer (or an anode buffer layer) may sometimes be formed between the hole transport layer and the anode layer. Accordingly, it is conceivable to accomplish prolongation of the lifetime by using a polymer compound having a high covering property and being capable of suppressing the degradation of the light-emitting layer, for such a hole transport layer or an anode interface layer.

SUMMARY OF THE INVENTION

The present inventors have found it possible to attain suppression of short circuiting and prolongation of the lifetime simultaneously by using a polymer compound for a hole transport layer in contact with an anode layer, or for an anode interface layer and by adjusting the value of the lowest unoccupied molecular orbit of that layer to be at least 2.1 eV.

Namely, the present invention provides an organic electroluminescence device comprising an anode layer, a cathode layer, a light-emitting layer present between the anode layer and the cathode layer, and a hole transporting thin film layer present between the light-emitting layer and the anode layer, wherein the hole transporting thin film layer in contact with the anode layer, contains at least 5 mass % of a polymer compound, and the value of the lowest unoccupied molecular orbit of the thin film layer is at least 2.1 eV.

The polymer compound of the hole transporting thin film layer in the organic EL device of the present invention, may be a hole transporting polymer compound or a polymer compound having no or little hole-transporting property. In the latter case, the hole transporting thin film layer contains such a polymer compound and a hole transporting low molecular weight compound.

Further, the light-emitting layer in the organic EL device of the present invention may be made of a light-emitting layer containing a conventional light-emitting organic compound, but is preferably a light-emitting layer having a long lifetime and a high luminous efficiency. As such a light-emitting layer, preferred is a light-emitting layer comprising three components i.e. a host compound, a first guest compound which is a compound having a glass transition temperature of at least 100° C. and a hole mobility which is larger than the hole mobility of the host compound, and a second guest compound which is a compound having a band gap which is smaller than the band gap of the host compound.

Further, "lowest unoccupied molecular orbital" will be referred to simply as "LUMO".

DETAILED DESCRIPTION OF THE PREFERRED EMBODIMENTS

As mentioned above, one of the causes for degradation of the device is considered to be accumulation of electron holes in the light-emitting layer. Accordingly, it is considered that if this accumulation of the carrier can be easily released, it is possible to suppress the degradation of the device. Further, it is considered that if the anode layer is sufficiently covered as mentioned above, it is possible to prevent short circuiting and to accomplish prolongation of the lifetime of the device. The hole transporting thin film layer in contact with the anode layer in the present invention is considered to attain all of these functions.

This mechanism will be described with reference to a case where emission of light is carried out by pulse driving. In the pulse driving, there will be periods during which no bias is applied between the electrodes and periods during which a bias is applied in a direction opposite to the direction during emission. What is decisive as to whether or not electrons are readily injected from the anode side during such periods, is considered to be the LUMO level. If the value of LUMO is large, during the periods during which a bias is applied in a direction opposite to the direction during emission, electrons are likely to be readily injected, and accordingly, electron holes accumulated in the light-emitting layer are likely to be released. Further, if the value of LUMO is small, during such periods, electrons are hardly injected, and electron holes accumulated in the light-emitting layer are hardly released. In the present invention, the value of LUMO of the hole transporting thin film layer is large (at a level of at least 2.1 eV), whereby the degradation of the light-emitting layer is believed to be effectively suppressed.

Here, such a value of LUMO is a value commonly used in the industrial field of organic EL devices and which is calculated as a value obtained by deducting a band gap value from the value of HOMO, where HOMO (highest occupied molecular orbital) is the work function measured by photoelectron spectroscopy (AC-1: manufactured by Riken Keiki Co., Ltd.) in the atmosphere, and the band gap value is the energy at an absorption end of the UV absorption spectrum.

In order to further increase such effects for suppressing the degradation, it is effective to use a material having a hole transporting property superior to the host compound, as a guest compound, in combination with the host compound, for the purpose of suppressing accumulation of the carrier in the light-emitting layer. Further, it is important to take the heat resistance into consideration, since this guest compound serves for transfer of the carrier, and it is preferred to use a compound having high heat resistance. Further, in order to suppress retention or accumulation of the carrier on the host compound, it is not desirable that the host compound emits light, and likewise, it is not desirable that the guest compound itself emits light, since the guest compound is one intended to serve for the transfer of the carrier.

Accordingly, it is preferred to use a separate light-emitting material in combination. As such a light-emitting material, it is preferred to use a light-emitting material having a band gap smaller than the band gap of the host compound, as a second guest compound, thereby to suppress the emission of the host compound or the above-mentioned guest compound (the first guest compound). Hereinafter, the above host compound will sometimes be referred to as a host compound (A), the above first guest compound as a guest compound (B), and the above second guest compound as a guest compound (C).

The above-mentioned preferred construction of the light-emitting layer of the organic EL device of the present invention is used in combination with the hole transporting thin film layer, whereby excellent characteristics can be obtained, and also in the driving lifetime at a high temperature, excellent characteristics can be obtained.

The organic EL device of the present invention comprises, at least, an anode layer, a cathode layer, a light-emitting layer present between the anode layer and the cathode layer, and a hole transporting thin film layer present between the light-emitting layer and the anode layer. The hole transporting thin film layer (hereinafter referred to as hole transporting layer) is a thin film layer in contact with the anode layer. In the case of a structure wherein a hole transport layer is in contact with the anode layer, it serves as the hole transport layer, and in the case of a structure wherein a hole transport layer and an anode interface layer are present, and the anode interface layer is in contact with the anode layer, it serves as the anode interface layer. In the organic EL device of the present invention, layers other than the above-mentioned layers may be present. For example, an electron transport layer may be present between the light-emitting layer and the cathode layer, and a cathode interface layer may further be present between the electron transport layer and the cathode layer.

In the present invention, the hole transporting layer contains at least 5 mass % of a polymer compound. In a case where the polymer compound is a hole transporting polymer compound, the hole transporting layer may be constituted solely by the hole transporting polymer compound. In such a case, the upper limit of the content of the polymer compound in the hole transporting layer is 100 mass % (i.e. the entire amount). In a case where the polymer compound is a polymer compound having no or little hole transporting property, the hole transporting layer comprises such a polymer compound and a hole transporting low molecular weight compound.

The content of the polymer compound in such a hole transporting layer is required to be at least 5 mass %, preferably at least 25 mass %. Further, even in a case where the polymer compound is a hole transporting polymer compound, the hole transporting layer may contain a hole transporting low molecular weight compound other than the polymer compound. In a case where the polymer compound is a polymer compound having no or little hole transporting property, the hole transporting layer preferably contains at least 5 mass %, particularly preferably from 10 to 75 mass %, of the hole transporting low molecular weight compound.

In the present invention, the value of LUMO of the hole transporting layer is at least 2.1 eV. The upper limit is not particularly limited, but it is about 3.5 eV in a case where the layer is constituted by materials which are readily available at present. The value of LUMO of the hole transporting layer can be changed variously by selecting the above-mentioned polymer compound or by selecting the respective types or the combination of the polymer compound and the low molecular weight compound.

The thickness of the hole transporting layer is preferably from 1 to 200 nm, particularly preferably from 1 to 40 nm.

Further, in a case where the hole transporting layer is an anode interface layer, it is preferably from 1 to 40 nm, and in a case where the hole transporting layer is a hole transport layer, it is preferably from 20 to 200 nm.

The above polymer compound or the hole transporting low molecular compound in the hole transporting layer is preferably a compound having high heat resistance, and specifically, it is preferably a compound having a high glass transition temperature. It is preferred to employ a compound which preferably has a glass transition temperature of at least 100° C., particularly preferably at least 130° C. By using a compound having such high heat resistance, it is possible to obtain an organic EL device having high heat resistance.

As mentioned above, as the polymer compound in the hole transporting layer, a hole transporting polymer compound or a polymer compound having no or little transporting property, is used. As such a polymer compound, a polymer compound having an aromatic ring such as a benzene ring or a thiophene ring on its main chain or side chain, is preferred. As the aromatic ring, a single ring such as a benzene ring, a condensed polycyclic ring such as a naphthalene ring, or a ring of a gathered ring system such as a biphenyl ring, may, for example, be mentioned. More preferably, it is a polymer compound having, on its main chain or side chain, a tertiary nitrogen atom having an aromatic ring bonded thereto. For example, it may be a condensation polymerization type polymer having, on its main chain, a residual group of a polyarylenepolyamine having all bonds of a nitrogen atom bonded to aromatic rings, or a vinyl polymer having such a residual group on its side chain. Specifically, it may, for example, be an aromatic polyether sulfone or an aromatic polycarbonate containing a bivalent nitrogen-containing arylene group having, as bonds, the 4-positions of phenyl groups at both terminals of tetraphenylbenzidine, or a vinyl polymer comprising polymerized units of a vinyl monomer such as a methacrylate having a monovalent nitrogen-containing aryl group having, as a bond, the 4-position of a phenyl group at one terminal of tetraphenylbenzidine. Further, it may, for example, be an aromatic polyether sulfone or an aromatic polycarbonate containing a bivalent oxadiazole group-containing arylene group having, as bonds, the 4-positions of phenyl groups at both terminals of 3,4-diphenyloxadiazole, or a vinyl polymer comprising polymerized units of a vinyl monomer such as a methacrylate having a monovalent residual group having, as a bond, the 4-position of a phenyl group at one terminal of 3,4-diphenyloxadiazole.

As the polymer compound, preferred are a vinyl polymer such as polyvinylcarbazole, a poly(3,4-ethylenedioxythiophene)/polystyrenesulfonate (PEDOT), or a polymethacrylate, and an aromatic condensation polymerized polymer such as an aromatic polycarbonate, an aromatic polysulfone, an aromatic polyether, an aromatic polyether ketone, an aromatic polyether sulfone or an aromatic polyester. At least part of repeating units in the aromatic condensation polymerized polymer are preferably repeating units containing the above-mentioned tertiary nitrogen atom having an aromatic ring bonded thereto, and for example, a tetraphenylbenzidine residual group-containing polyarylene ether sulfone or a tetraphenylbenzidine residual group-containing polyarylene ether ketone (hereinafter referred to simply as "PTPDEK") may, for example, be mentioned.

As the hole transporting low molecular weight compound, a conventional hole transporting compound known as a material for the conventional hole transport layer or the anode interface layer, may be employed. As the low molecular weight hole transporting compound, the after-mentioned guest compound (B) is preferred, but it is not limited thereto, and for example, a compound having a glass transition point of at most 100° C., may also be used. As the low molecular weight hole transporting compound, the after-mentioned polyarylpolyamine is particularly preferred. For example, an aromatic polyamine compound such as N,N'-diphenyl-N,N'-bis(3-methylphenyl)-biphenyl-4,4'-diamine (hereinafter referred to simply as "TPD"), N,N'-diphenyl-N,N'-bis(1-naphthyl)-biphenyl-4,4'-diamine (hereinafter referred to simply as "NPD"), N,N'-diphenyl-N,N'-bis(9-phenanthryl)-biphenyl-4,4'-diamine (hereinafter referred to simply as "PPD") or 4,4',4"-tris(3-methylphenylamino)triphenylamine (hereinafter referred to simply as "MTDATA"), may be mentioned. Further, it is possible to employ a hydrazone compound disclosed in JP-A-2-311591. Such hole transporting low molecular weight compounds may be used in combination of two or more of them.

In the present invention, the method for forming the hole transporting layer is not particularly limited, but preferred is a method in which the polymer compound and, if desired, the low molecular weight compound, are dissolved in a solvent, and the solution is used to form a coating film by means of a spin coating method, an ink jet method, a spray coating method or the like, followed by removing the solvent by evaporation to form a thin film layer.

As mentioned above, the light-emitting layer in the organic EL device of the present invention is preferably a light-emitting layer comprising at least three components i.e. the host compound (A), the guest compound (B) and the guest compound (C). The light-emitting layer may contain two or more types of each of these components. For example, it may contain two or more guest compounds (B), or two or more guest compounds (C). Each of the host compound (A), the guest compound (B) and the guest compound (C) preferably has fluorescence or phosphorescence and has a high quantum yield. However, in the light-emitting layer comprising these three components, of the organic EL device of the present invention, the compound which actually emits light, is substantially the guest compound (C) only.

The guest compound (C) may be a compound having a glass transition temperature of at least 100° C. (hereinafter sometimes referred to also as a high Tg compound), and its hole mobility may be larger than the hole mobility of the host compound. In a case where the guest compound (C) is a hole transporting and high Tg compound, it will be a compound hardly distinguishable from the guest compound (B). However, in such a case, in the present invention, on the basis of the difference in the relative band gap between the guest compound (B) and the guest compound (C) or the difference in the hole mobility, a compound which actually emits light in the light-emitting layer is taken as the guest compound (C), and a guest compound which does not substantially emit light will be taken as the guest compound (B).

In the light-emitting layer, the guest compound (B) serves to move a large amount of the carrier to the guest compound (C) without letting the carrier accumulate on the host compound (A), whereby the increase of the driving voltage for the light-emitting layer can be suppressed, and the effect for improving the half luminance lifetime can be obtained. Such a guest compound (B) is required to have heat resistance in order to play a role to move a large amount of the carrier, and the guest compound (B) is a high Tg compound, whereby it has such heat resistance.

The guest compound (C) is a compound which substantially emits light in the light-emitting layer, and it emits light upon receipt of the carrier moved from the host compound or the guest compound (B). In order to suppress the emission of the host compound, it is necessary to adjust the band gap of the guest compound (C) to be smaller than the band gap of the host compound. By the use of such a guest compound (C), it is possible to suppress the increase of the voltage associated with the emission and to obtain an effect to improve the half luminance lifetime.

As a material useful as the host compound (A), a material having a large fluorescent quantum yield may be used. For example, a fluorescent brightener of a benzothiazole type, a benzoxazole type or a benzimidazole type, a metal-chelated oxinoide compound, a styrylbenzene compound may, for example, be mentioned. However, the useful material is not limited thereto.

Among metal-chelated oxinoide compounds, a 8-oxyquinoline type complex represented by the formula (1) can be used particularly preferably.

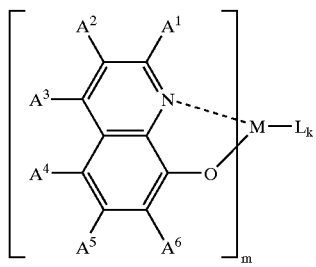

(1)

In the above chemical formula, each of $A^1$ to $A^6$ which are independent of one another, is a hydrogen atom, a halogen atom, a nitro group, a hydroxyl group, a cyano group, a $C_{1-12}$ alkyl group, a $C_{1-12}$ alkoxy group, an aryl group, an aryloxy group, an acyl group, an arylamine group, an aralkyl group, an alkylamino group or a monovalent aromatic hydrocarbon group, M is a metal atom, m is an integer of from 1 to 3 depending upon the valency of metal atom M, L is an alkoxy group or an aryloxy group, and k is an integer of from 0 to 2 depending upon m and the valency of metal atom M. Some of hydrogen atoms in the above organic group such as an alkyl group may be substituted by halogen atoms, and an oxygen atom may be inserted between a carbon-carbon bond in the above organic group such as an alkyl group.

The metal atom M in this 8-oxyquinoline type complex may, for example, be lithium, silver, beryllium, magnesium, calcium, strontium, zinc, cadmium, aluminum, gallium, indium, thallium, yttrium, scandium, lanthanum, lead, zirconium, manganese or lutetium. Among them, it is possible to preferably use a complex having, as the center metal, beryllium, magnesium, aluminum, zinc or scandium, having a high fluorescent quantum yield.

The guest compound (B) is not particularly limited so long as it is a compound having a Tg of at least 100° C. and a hole mobility which is larger than the hole mobility of the host compound. However, it is preferably selected from compounds known as guest compounds in a light-emitting layer of an organic EL device. As such a guest compound (B), a compound having an aromatic ring (hereinafter referred to as an aryl compound, and the aromatic-ring group will be referred to as an aryl group) is preferred. It is particularly preferably selected from aryl compounds having two or more aromatic rings.

A condensed polycyclic compound having two or more aromatic rings condensed is regarded as one having two or more aromatic rings. Specifically, the guest compound having two or more aromatic rings may, for example, be an aryl compound, such as, an aromatic hydrocarbon such as biphenyl, terphenyl, naphthalene, anthracene, naphthacene, pentacene, phenanthrene, phenalene, triphenylene, pyrene, chrysene, picene, perylene, pentaphene, benzophenanthrene, dibenzophenanthrene, benzanthracene, dibenzanthracene, benzonaphthacene or coronene, or its derivative, or an arylamine compound such as a triarylamine or a polyarylpolyamine, or its derivative.

As the above aromatic hydrocarbon, an aromatic hydrocarbon of a condensed polycyclic type having at least 2 (particularly from 2 to 6) rings or a gathered ring type having at least 2 (particularly from 2 to 6) rings, is preferred. Its derivative may, for example, be a compound having at least one hydrogen atom in the aromatic hydrocarbon substituted by a substituent such as an alkyl group, an alkenyl group, a cycloalkyl group, an alkoxy group, an alkylthio group, an aralkyl group, an aryloxy group, an arylthio group, an amino group, a monoalkylamino group, a dialkylamino group, a monoarylamino group, an alkylarylamino group, an acyl group, a cyano group, a halogen atom (particularly a fluorine atom or a chlorine atom) or a monovalent group having a hydrogen atom removed from a monocyclic or polycyclic heterocyclic compound.

Further, in a case where the aromatic hydrocarbon is a condensed polycyclic hydrocarbon, it may be a derivative wherein at least one hydrogen atom thereof is substituted by a substituent such as a monovalent group (such as a phenyl group) having a hydrogen atom removed from a monocyclic aromatic hydrocarbon. The aryl group, the alkyl group or the like in the above-mentioned substituent may also have the above-mentioned substituent. The substituent in the above aromatic hydrocarbon may, for example, be an alkyl group, an alkenyl group, an alkoxy group, an aryloxy group, an aralkyl group, an aryloxy group, a dialkylamino group or a monovalent aromatic heterocyclic group, preferably an organic group having at most 12 carbon atoms and a halogen atom. The most preferred substituent is an alkyl group having at most 4 carbon atoms.

Further, in a case where the aromatic hydrocarbon is a condensed polycyclic hydrocarbon, a phenyl group which may be substituted by an alkyl group having at most 4 carbon atoms, a halogen atom or the like, is also a preferred substituent.

The above-mentioned arylamine compound is a compound having at least one nitrogen atom having an aryl group bonded thereto, and it is preferably a compound wherein all of the three bonds of a nitrogen atom are bonded to monovalent or polyvalent aryl groups. The triarylamine is a compound having one nitrogen atom to which three aryl groups are bonded, and the polyarylpolyamine is a compound having at least two such nitrogen atoms, wherein all bonds of all nitrogen atoms are preferably bonded to aryl groups. As the polyvalent aryl group, a bivalent or trivalent aryl group is preferred.

The aryl group in the arylamine compound is preferably a monovalent aryl group having one hydrogen atom bonded to an aromatic ring removed from the above-mentioned aromatic hydrocarbon or its derivative, a polyvalent aryl group having at least two such hydrogens atoms removed, or a monovalent to trivalent benzene ring. Further, a plurality of aryl groups in the arylamine compound may be different from one another. In the present invention, the arylamine compound is preferably a polyarylpolyamine having from 2 to 10 nitrogen atoms having aryl groups bonded thereto, particularly preferably a polyarylpolyamine having from 2 to 6 such nitrogen atoms.

The polyarylpolyamine has at least one polyvalent aryl group having two or more nitrogen atoms connected thereto. The polyvalent aryl group may, for example, be a bivalent aryl group having two nitrogen atoms connected thereto, or a trivalent aryl group having three nitrogen atoms connected thereto. The polyarylpolyamine is preferably a compound having at least one bivalent aryl group having two nitrogen atoms connected thereto. The bivalent aryl group is preferably a phenylene group or a bivalent group wherein two or more phenylene groups are connected (a polyphenyl-diyl group such as a biphenyl-4,4'-diyl group). The bivalent aryl group is preferably a poly-p-phenylene group wherein the number of p-phenylene group is from 2 to 5 (particularly 2 or 3). The polyarylpolyamine further has at least one monovalent aryl group bonded to a nitrogen atom. The monovalent aryl group in the polyarylpolyamine is preferably a phenyl group, a 4-biphenylyl group, a 1-naphthyl group, or a 9-phenanthryl group. To such monovalent to polyvalent aryl groups, substituents as mentioned above may be bonded, and as such substituents, an alkyl group having at most 4 carbon atoms, or a halogen atom, is preferred.

As the guest compound (B), a polyarylpolyamine is preferred. As the guest compound (B), particularly preferred is a compound of the following formula (2) and a compound of the following formula (5), which are compounds in the category of polyarylpolyamines. Hereinafter, these compounds will be referred to as the compound (2) and the compound (5), respectively, by means of the numbers of the chemical formulae. Also in the following description, the same will apply to a compound or an organic group represented by a chemical formula specified by a number.

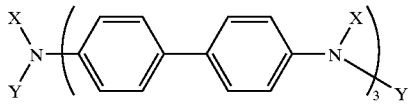

(2)

In the formula (2), X is a phenyl group of the following formula (3), and Y is a phenyl group of the following formula (3) or a 1-naphthyl group of the following formula (4), provided that four X and two Y may be different from one another, respectively.

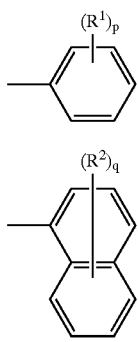

(3)

(4)

In the above formulae (3) and (4), each of $R^1$ and $R^2$ which are independent of each other, is an alkyl group, an alkenyl group, a cycloalkyl group, an alkoxy group, an alkylthio group, an aryl group, an aralkyl group, an aryloxy group, an arylthio group, an amino group, a monoalkylamino group, a dialkylamino group, a monoarylamino group, an alkylarylamino group, an aromatic heterocyclic group, an acyl group, a cyano group or a halogen atom, p is an integer of from 0 to 3, and in a case where p is 2 or 3, a plurality of $R^1$ may be different from one another, and q is an integer of from 0 to 4, and when q is from 2 to 4, the plurality of $R^2$ may be different from one another.

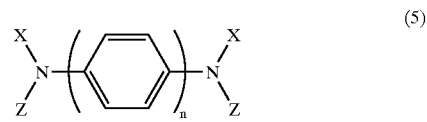

(5)

In the formula (5), X is a phenyl group of the following formula (3), Z is a 9-phenanthryl group of the following formula (6), and n is an integer of from 1 to 5, provided that two X and two Z may be different from each other, respectively.

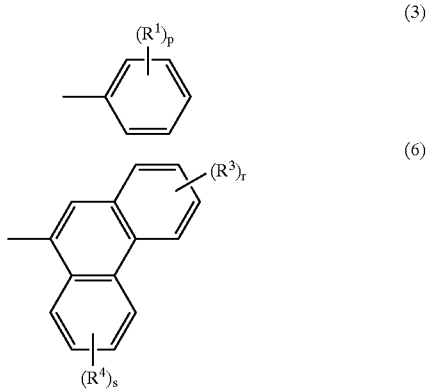

(3)

(6)

In the above formulae (3) and (6), each of $R^1$, $R^3$ and $R^4$ which are independent of one another, is an alkyl group, an alkenyl group, a cycloalkyl group, an alkoxy group, an alkylthio group, an aryl group, an aralkyl group, an aryloxy group, an arylthio group, an amino group, a monoalkylamino group, a dialkylamino group, a monoarylamino group, an alkylarylamino group, an aromatic heterocyclic group, an acyl group, a cyano group or a halogen atom, p is an integer of from 0 to 3, and when p is 2 or 3, the plurality of $R^1$ may be different, r is an integer of from 0 to 4, and when r is from 2 to 4, the plurality of $R^3$ may be different, and s is an integer of from 0 to 4, and when s is from 2 to 4, the plurality of $R^4$ may be different.

The compound (2) is a derivative of tris(4,4'-biphenylylene)tetramine, wherein X is a phenyl group (3) which is a phenyl group which may have a substituent, and Y is a phenyl group (3) or a naphthyl group (4) which is a 1-naphthyl group which may have a substituent. The number p of substituents ($R^1$) in the phenyl group (3) is an integer of from 0 to 3, and when p is 1, the 4-position is preferably substituted, when p is 2, the 3- and 4-positions are preferably substituted, and when p is 3, the 3-, 4- and 5-positions are preferably substituted. It is preferred that p is 0 or 1. When p is 2 or 3, the plurality of substituents ($R^1$) may be different. The number q of substituents ($R^2$) in the naphthyl group (4) is an integer of from 0 to 4, and when q is at least 1, the substituent is preferably bonded to at least one of the 3- to 6-positions, and when q is 1 or 2, the substituent is preferably bonded to either one or both of the 4- and 5-positions. q is preferably from 0 to 2, particularly preferably from 0 or 1. When q is from 2 to 4, the plurality of substituents ($R^2$) may be different.

Four X in the compound (2) may be different from one another. Particularly, X bonded to a nitrogen atom on each terminal side and X bonded to a nitrogen atom between the biphenylene groups may be different. X bonded to a nitrogen atom at each terminal side is preferably a phenyl group or a monosubstituted phenyl group, and each X bonded to a nitrogen atom between biphenylene groups is preferably a phenyl group. Two Y may also be different, but it is preferred that each of them is a phenyl group (3), or each of them is a naphthyl group (4).

In the compound (5), n is an integer of from 1 to 5, preferably from 2 or 3, particularly preferably 2. The compound (5) wherein n is 1 is a derivative of 1,4-phenylenediamine, and in a case where n is 2 or more, it is a derivative of a (poly p-phenylene)diamine. In a case where n is 2, it is a derivative of 4,4'-biphenylylenediamine (i.e. benzidine).

In the compound (5), X is the same phenyl group (3) as mentioned above, and the preferred phenyl group (3) in the compound (5) is the same as one in the compound (2). Z is a phenanthryl group (6) which is a 9-phenanthryl group which may have a substituent. The numbers r and s of substituents ($R^3$) and substituents ($R^4$) in the phenanthryl group (6) are integers of from 0 to 4, respectively. When r is 1 or 2, the substituent ($R^3$) is preferably bonded to one or both of the 6- and 7-positions, and when s is 1 or 2, the substituent ($R^4$) is preferably bonded to one or both of the 2- and 3-positions. Each of r and s is preferably an integer of from 0 to 2. In a case where a plurality of substituents ($R^3$) are present, they may be different. Likewise, in a case where a plurality of substituent ($R^4$) are present, they may be different. Two Z may be different, but they are preferably the same phenanthryl group (6). It is most preferred that each of the two Z is a 9-phenanthryl group having no substituent.

$R^1$ to $R^4$ which are substituents in the above compound (2) and (5), are monovalent groups, and each of them which are independent of one another, is preferably an alkyl group, an alkenyl group, a cycloalkyl group, an alkoxy group, an alkylthio group, an aryl group, an aralkyl group, an aryloxy group, an arylthio group, an amino group, a monoalkylamino group, a dialkylamino group, a monoarylamino group, an alkylarylamino group, an aromatic heterocyclic group, an acyl group, a cyano group or a halogen atom (particularly a fluorine atom or a chlorine atom). The ring of the cycloalkyl group, the aryl group, the aromatic heterocyclic group or the like, may have a substituent such as an alkyl group. Further, the carbon number of the above organic group such as an alkyl group is preferably at most 12.

Each of $R^1$ to $R^4$ may specifically be, for example, a methyl group, an ethyl group, a propyl group, an isopropyl group, a butyl group, an allyl group, a cyclohexyl group, a methoxy group, an ethoxy group, a methylthio group, a phenyl group, a 4-methylphenyl group, a methoxyphenyl group, a phenylmethyl group, a 2-phenylethyl group, a phenoxy group, a phenylthio group, a monoethylamino group, a diethylamino group, a phenylmethylamino group, an acetyl group or a benzyl group. As the substituent, an alkyl group having at most 4 carbon atoms is particularly preferred.

The guest compound (C) is a compound having a band gap which is smaller than the band gap of the host compound and is a luminescent dye which emits light when combined with the above host compound (A) and the guest compound (B). The guest compound (C) is not particularly limited so long as it is a compound having such characteristics, but it is preferably selected from compounds known as guest compounds for light-emitting layers of organic EL devices.

Such a guest compound (C) may, for example, be a laser dye, such as a styrylbenzene dye such as 4-dicyanomethylene-2-methyl-6-p-dimethylaminostyryl-4H-pyran, an oxazole dye, a perylene dye, a coumarin dye or an acridine dye, a condensed polycyclic aromatic hydrocarbon compound such as an anthracene derivative, a naphthacene derivative or a pentacene derivative, a fluorescent dye to be used as a fluorescent brightener such as a quinacridone derivative, a benzothiazole compound or a benzimidazole compound, or a metal-chelated oxinoide compound. The guest compound (C) can be selected from such compounds depending upon the luminescent color intended by the organic EL device, and it is possible to adjust the luminescent color by combining a plurality of such compounds.

A preferred light-emitting layer in the present invention is made of a composition comprising the host compound (A), the guest compound (B) and the guest compound (C), and in the light-emitting layer, these compounds are usually in a state of being uniformly mixed. The light-emitting layer may contain compounds other than these compounds, but it is usually made solely of these compounds (provided that each compound may contain two or more types). In this light-emitting layer, the amount of the guest compound (B) is preferably from 1 to 60 mol %, particularly preferably from 3 to 50 mol %, based on the total amount of the host compound (A), the guest compound (B) and the guest compound (C). The most preferred amount of the guest compound (B) is from 10 to 40 mol %. In this light-emitting layer, the amount of the guest compound (C) is preferably from 0.001 to 40 mol %, particularly preferably from 0.01 to 20 mol %, based on the total amount of the host compound (A), the guest compound (B) and the guest compound (C).

The light-emitting layer comprising the host compound (A), the guest compound (B) and the guest compound (C) may be formed from a mixture having these compounds preliminarily mixed, or may be formed by mixing these compounds at the time of forming the light-emitting layer. For example, in a case where the light-emitting layer is to be formed by a spin coating method, the light-emitting layer may be formed by using a solution containing the host compound (A), the guest compound (B) and the guest compound (C). For example, in a case where the light-emitting layer is formed by a vacuum vapor deposition method, the light-emitting layer comprising these compounds, may be formed by sublimating the host compound (A), the guest compound (B) and the guest compound (C), respectively, from three boats containing the respective compounds, or the light-emitting layer may be formed by sublimating these compounds from one boat containing a mixture of these compounds. It is also possible to form a light-emitting layer from a mixture of two compounds among these three compounds, and the remaining compound.

The organic EL device of the present invention is an organic EL device having the above light-emitting layer between an anode layer and a cathode layer and the above hole transporting layer between the light-emitting layer and the anode layer. Now, the organic EL device of the present invention will be described with reference to drawings.

Figure 1:
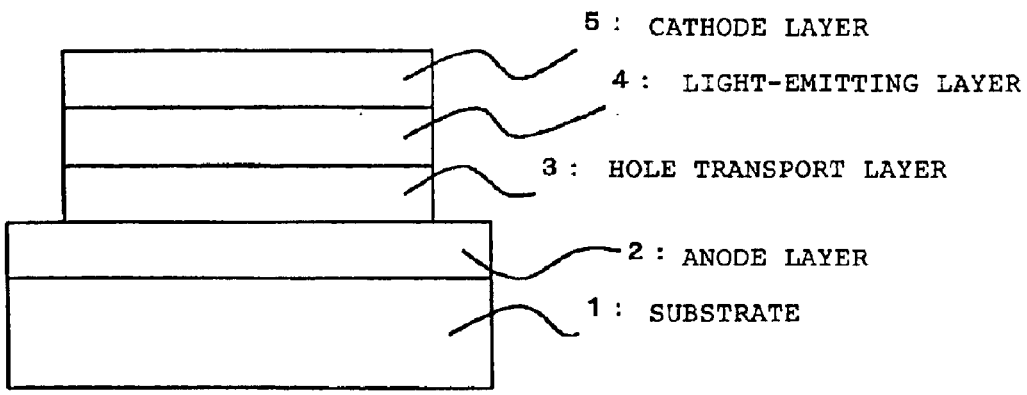
FIG. 1 is a side view illustrating the basic structure of the organic EL device of the present invention.

The organic EL device shown in FIG. 1, has a structure in which a substrate 1, an anode layer 2, a hole transport layer 3, a light-emitting layer 4 and a cathode layer 5 are laminated in this order. The organic EL device shown in FIG. 2 has a structure in which, in addition to the basic structure shown in FIG. 1, an anode interface layer 6 is provided between the anode layer 2 and the hole transport layer 3, and between the light-emitting layer 4 and the cathode layer 5, an electron transport layer 7 is provided on the light-emitting layer 4 side, and a cathode interface layer 8 is provided on the cathode 5 side.

The substrate 1 is a support of the organic EL device, and it is common to employ a transparent substrate of e.g. glass or a plastic film. The plastic may, for example, be a polycarbonate, a polymethacrylate or a polysulfone.

The anode layer 2 is preferably a transparent electrode layer and is formed on the substrate 1. Such a transparent electrode layer is usually composed of a thin film of an indium tin oxide (ITO) or a thin film of a tin oxide. Otherwise, it may be constituted by a thin film made of a material such as an inorganic electrically conductive substance such as a metal such as silver or gold, or copper iodide, having a large work function, or an electrically conductive polymer such as a poly(3-methylthiophene), a polypyrrole or a polyaniline.

As a method for preparing such an anode layer, it is common to employ a vacuum deposition method, a sputtering method or an ionizing vapor deposition method. However, in the case of an electrically conductive polymer, a thin film may be prepared by coating a solution thereof with a suitable binder, on the substrate, or such a thin film may be directly formed on the substrate by electrolytic polymerization. The thickness of the transparent electrode layer depends on the required transparency. The transmittance of a visible light is usually required to be at least 60%, preferably at least 80%, and in such a case, the thickness is usually from 5 to 1,000 nm, preferably from 10 to 500 nm.

Figure 2:
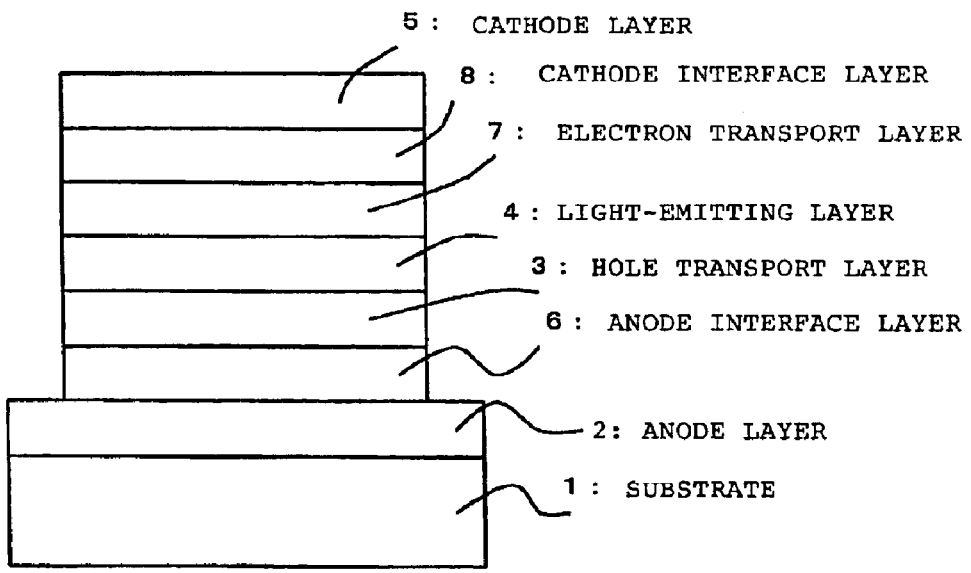
FIG. 2 is a side view illustrating another embodiment of the organic EL device of the present invention.

In the construction shown in FIG. 1 or 2, the light-emitting layer 4 is formed on a hole transport layer 3. This light-emitting layer 4 is preferably the above-described light-emitting layer comprising the host compound (A) and two types of guest compounds (B) and (C). The thickness of the light-emitting layer 4 is usually from 10 to 200 nm, preferably from 20 to 80 nm. As the method for preparing this light-emitting layer 4, various methods may be used such as a vacuum vapor deposition method, a dipping method, a spin coating method, an LB method, etc. In order to prepare a uniform thin film of a submicron order free from defects such as pin holes, a vacuum vapor deposition method or a spin coating method is particularly preferred. As a method for mixing the host compound and the two types of guest compounds, in the case of the vacuum vapor deposition method, a method of sublimating materials mixed in a predetermined ratio from a single boat or crucible, or a method of sublimating the plurality of materials separately from a plurality of boats, may be employed. In the case of the spin coating method, it is preferred to dissolve the plurality of materials in a predetermined ratio in a solvent, followed by film-forming.

As the material for the cathode layer 5, various materials may be used including known cathode materials for organic EL devices. For example, a magnesium/aluminum alloy, a magnesium/silver alloy, a magnesium/indium alloy, an aluminum/lithium alloy or aluminum may be mentioned.

As the method for preparing the cathode layer 5, various known methods may be used such as a vacuum vapor deposition method, an ionizing vapor deposition method, an EB vapor deposition method, a sputtering method, etc. In order to prepare a uniform thin film free from defects such as pin holes, a vacuum vapor deposition method is particularly preferred. The thickness of the cathode layer is usually from 10 to 1,000 nm, preferably from 50 to 300 nm.

As shown in FIG. 1, in a case where the hole transport layer 3 is in contact with the anode layer 2, this hole transport layer 3 is a hole transporting layer (i.e. a hole transporting thin film layer). In such a case, the hole transport layer 3 is a layer which contains at least 5 mass % of a polymer compound and which has a value of the lowest unoccupied molecular orbit of at least 2.1 eV, as mentioned above. On the other hand, as shown in FIG. 2, in a case where the anode interface layer 6 is in contact with the anode layer 2, this anode interface layer 6 is a hole transporting layer (i.e. a hole transporting thin film layer). In this case, the anode interface layer 6 is a layer which contains at least 5 mass % of a polymer compound and which has a value of the lowest unoccupied molecular orbit of at least 2.1 eV, as mentioned above. In the latter case, the hole transport layer 3 may not be a hole transporting layer (i.e. a hole transporting thin film layer), and is preferably a hole transport layer containing no polymer compound. Now, the hole transport layer in the organic EL device having the structure shown in FIG. 2 will be described.

As the hole transporting material to be used for the hole transport layer 3 shown in FIG. 2, a material having a low hole injection barrier from the anode interface layer 6 and a high hole mobility, can be used. As such a hole transporting material, a conventional hole transporting compound known as a material for the conventional hole transport layer or anode interface layer, can be used. The above-mentioned polyarylpolyamine is particularly preferred. An aromatic diamine compound such as TPD, NPD, PPD or MTDATA, or a hydrazone compound may, for example, be used. Particularly preferred is the above-mentioned polyarylene polyamine. Further, the above-mentioned hole transporting polymer compound such as poly-N-vinylcarbazole, or other hole transporting polymer compound such as polysilane, may also be used (Appl. Phys. Lett., 59, 2760 (1991)). Two or more such hole transporting compounds may be used in combination.

As the hole transporting compound, not only the above-mentioned organic material, but also an inorganic material may be used. As such an inorganic material, a metal-chalcogen compound, a metal halide, a metal carbonate, nickel oxide, lead oxide, copper iodide, a p-type compound semiconductor such as lead sulfide, a p-type hydrogenated amorphous silicon semiconductor, or a p-type hydrogenated amorphous silicon carbide semiconductor may, for example, be mentioned. Two or more such hole transporting materials may be used in combination, and further, an inorganic material may be used in combination with an organic hole transporting material.

In the hole transport layer 3 shown in FIG. 2, in order to improve the heat resistance or the uniformity of the thin film, a polymer compound which is not likely to be a trap for electron holes may be used as a binder in admixture with the hole transporting material. As such a binder, the above-mentioned hole transporting polymer compound or a polymer compound having no or little hole transporting property, may be used. The content of the binder is preferably from 10 to 50 mass %, not to reduce the hole mobility.

In a case where either an organic material or an inorganic material is used, the thickness of the hole transport layer is usually from 10 to 200 nm, preferably from 20 to 80 nm. As a method for preparing such a hole transport layer, various known methods may be used such as a vacuum vapor deposition method, a dipping method, a spin coating method, an LB method, a CVD method, etc. In order to prepare a uniform thin film of a submicron order free from defects such as pin holes, a vacuum vapor deposition method or a spin coating method is particularly preferred.

The electron transport layer 7 may be formed, as the case requires, between the light-emitting layer 4 and the cathode layer 5. As the electron transporting material for this electron transport layer 7, a material having a high electron affinity and a large electron mobility, will be used. As a material satisfying such conditions, a cyclopentadiene derivative (JP-A-2-289675), an oxadiazole derivative (JP-A-2-216791), a bisstyrylbenzene derivative (JP-A-1-245087), a p-phenylene compound (JP-A-3-33183), a phenanthroline derivative (JP-A-5-331459) or a triazole derivative (JP-A-7-90260) may, for example, be mentioned.

The cathode interface 8 may be formed, as the case requires, between the electron transport layer 7 and the cathode layer 5. By providing such an interface layer, it is possible to attain reduction of the driving voltage, improvement of the luminous efficiency or prolongation of the lifetime. Such a cathode interface layer 8 has an effect to facilitate injection of electrons from the cathode layer 5 or an effect to improve the adhesion to the cathode layer.

As the material of such a cathode interface layer 8, an alkali metal fluoride such as lithium fluoride (Appl. Phys. Lett., 70, 152 (1997)), a fluoride of an alkaline earth metal, or an oxide of an alkali metal or an alkaline earth metal, such as magnesium oxide, strontium oxide, aluminum oxide or lithium oxide, may be mentioned. In a case where such a material is an insulating material by itself, the film thickness to be used is usually as thin as not more than 5 nm, preferably at most 2 nm, whereby tunnel injection of electrons from the cathode layer is considered to be possible. Further, an organic substance such as a β-diketone complex of an alkali metal or an alkaline earth metal may also be used as the material for the cathode interface layer 8.

As a method for preparing such an electron transport layer 7 or a cathode interface layer 8, various known methods may be used such as a vacuum vapor deposition method, a dipping method, a spin coating method, an LB method, a CVD method, etc. In order to prepare a uniform thin film of submicron order free from defects such as pin holes, a vacuum vapor deposition method or a spin coating method is particularly preferred.

The organic EL device of the present invention is not limited to the structures shown in FIGS. 1 and 2, and within a range where the function as the organic EL device is obtainable, the above-described layers themselves may be formed of a plurality of layers, or another layer may be interposed therebetween. A method for preparing such layers, various known methods may be used such as a vacuum vapor deposition method, a dipping method, a spin coating method, an LB method, a CVD method, etc.

In the organic EL device of the present invention, in order to secure the storage stability and driving stability in the atmosphere, it is preferred that the polymer film or the inorganic protecting film is subjected to coating or glass sealing to shield it from oxygen or moisture in the atmosphere. However, it is preferred that a small amount of oxygen is contained in the sealed space, since such will provide an effect to suppress short circuiting. Further, it is also preferred to seal in a water-capturing agent in the sealed space.

The organic EL device of the present invention may be used as an entire surface illuminant and may be used as a back light of a liquid crystal display device or as a wall surface illuminating device, or patterning may be carried out to form pixels so that it may be used as a display.

Now, specific embodiments of the present invention will be described with reference to Examples and Comparative Examples. However, it should be understood that the present invention is by no means restricted thereto. Further, the evaluation methods of the organic EL devices will be described in the section for the evaluation results given hereinafter.

EXAMPLE 1

Present Invention

On a glass substrate, ITO was vapor-deposited in a thickness of 200 nm to form an anode layer 2 (sheet resistance: 7 Ω/□). A solution prepared by dissolving PPD of the following formula (8) (hereinafter referred to as the compound (8)) and a polyvinylcarbazole in a mass ratio of 1:2 in dichloromethane, was coated on the above anode layer 2 by a spin coating method, followed by drying to form an anode interface layer 6 having a thickness of 15 nm. Then, on the anode interface layer 6, the compound (8) was vapor-deposited in a thickness of 60 nm by a vacuum vapor deposition method to form a hole transport layer 3.

Then, Alq (host compound (A)) being the compound of the following formula (7), the compound (8) (guest compound (B)) and coumarin 545T of the following formula (9) (guest compound (C)) were, respectively, by means of separate boats, co-vapor-deposited in a thickness of 30 nm to form a light-emitting layer 4. The concentration of the compound (8) in the obtained light-emitting layer was 30 mol %, and the concentration of coumarin 545T was 1.0 mol %.

Then, on the light-emitting layer 4, Alq was vapor-deposited in a thickness of 30 nm to form an electron transport layer 7. Further, on the electron transport layer 7, 0.5 nm of a layer of LiF as a cathode interface layer 8 and then 200 nm of an aluminum layer as a cathode layer 5 were vacuum-vapor-deposited sequentially to prepare an organic EL device. The vacuum degree at that time was $8.0 \times 10^{-6}$ Torr. With respect to the obtained device, the measurement of the lifetime was carried out by the after-mentioned method.

Here, LUMO of the above anode interface layer 6 was 2.3 eV. Further, Tg of the compound (8) was 147° C., and its hole mobility was larger than Alq, and the band gap of coumarin 545T was smaller than the band gap of Alq.

(7)

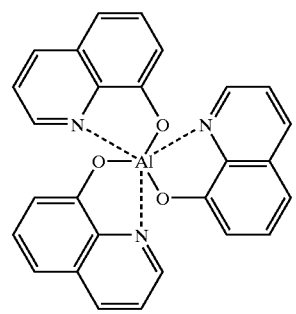

-continued (8)

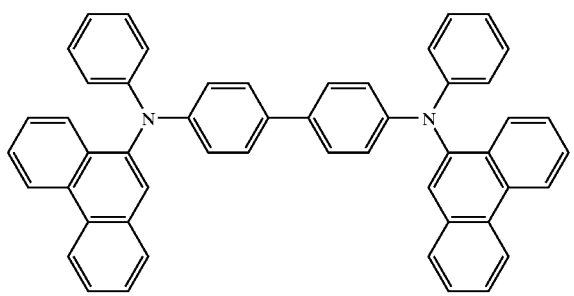

(9)

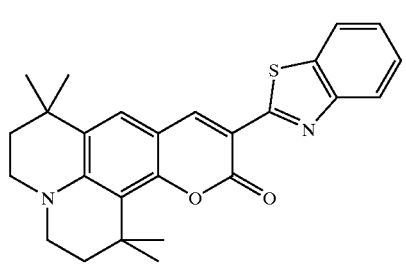

EXAMPLE 2

Present Invention

A device was prepared and evaluated in the same manner as in Example 1 except that the construction of the light-emitting layer 4 in Example 1 was changed. Namely, Alq and coumarin 545T were, respectively, by means of separate boats, co-vapor-deposited in a thickness of 30 nm to form a light-emitting layer 4 (without using the compound (8)). The concentration of coumarin 545T in the light-emitting layer 4 was 1.0 mol %.

EXAMPLE 3

Present Invention

A device was prepared and evaluated in the same manner as in Example 1 except that the construction of the light-emitting layer 4 in Example 1 was changed. Namely, a light-emitting layer 4 was formed by using the same material as in Example 1 except that a compound of the following formula (10) (DCJTB) was used in an amount of 2 mol %, instead of coumarin 545T as the luminescent dye in the light-emitting layer 4 (the concentration of the compound (8) was 30 mol %). Here, DCJTB is a luminescent dye having a band gap which is smaller than the band gap of the host compound Alq.

(10)

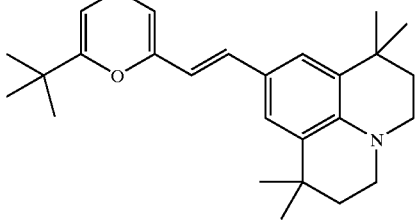

EXAMPLE 4

COMPARATIVE EXAMPLE

A device was prepared and evaluated in the same manner as in Example 1 except that instead of the anode interface layer 6 in Example 1, the following anode interface layer 6 was formed by means of the following solution. Namely, a solution in cyclohexanone having a tetraphenylbenzidine residual group-containing polyarylene ether ketone (PTPDEK) having a repeating unit of the following formula (11) dissolved, was coated on the above anode layer 2 by a spin coating method, followed by drying to form an anode interface layer 6 having a thickness of 20 nm. Here, the value of LUMO of the anode interface layer (PTPDEK only) was 2.0 eV.

(11)

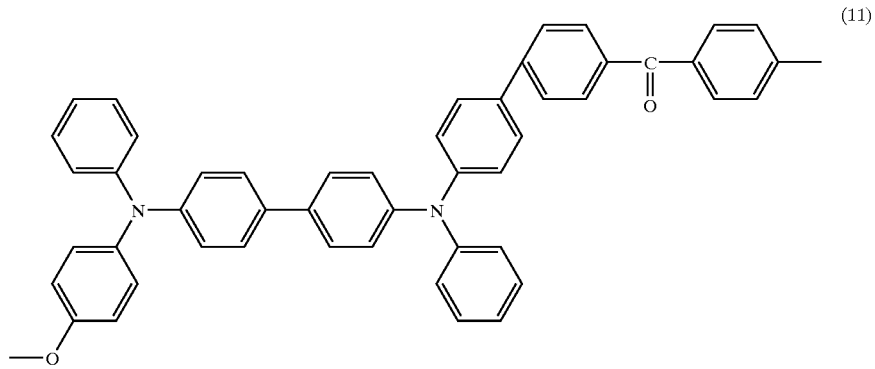

EXAMPLE 5

Present Invention

A device was prepared and evaluated in the same manner as in Example 1 except that instead of the anode interface layer 6 in Example 1, the following anode interface layer 6 was formed by using the following solution. Namely, a solution in cyclohexanone having a compound of the following formula (12) (TPD) and the above-mentioned tetraphenylbenzidine residual group-containing polyarylene ether ketone (PTPDEK) dissolved in a mass ratio of 2:1, was coated on the above anode layer 2 by a spin coating method, followed by drying to form an anode interface layer 6 having a thickness of 20 nm. Here, the value of LUMO of the anode interface layer was 2.4 eV.

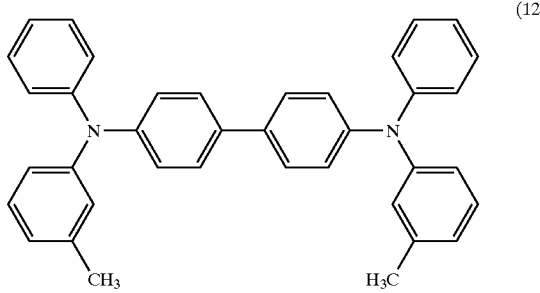

(12)

EXAMPLE 6

COMPARATIVE EXAMPLE

A device was prepared and evaluated in the same manner as in Example 1 except that instead of the anode interface layer 6 in Example 1, the following anode interface layer 6 was formed by using the following solution. Namely, a solution in dichloromethane having the compound (8) and the polyvinylcarbazole dissolved in a mass ratio of 97:3, was coated on the above anode layer 2 by a spin coating method, followed by drying to form an anode interface layer 6 having a thickness of 15 nm. Here, the value of LUMO of the anode interface layer was 2.4 eV.

EXAMPLE 7

Present Invention

A device was prepared and evaluated in the same manner as in Example 1 except that instead of the anode interface layer 6 in Example 1, the following anode interface layer 6 was formed by using the following solution. Namely, a solution in dichloromethane having the compound of the above formula (12) (TPD) and polyvinylcarbazole dissolved in a mass ratio of 1:1, was coated on the above anode layer 2 by a spin coating method, followed by drying to form an anode interface layer 6 having a thickness of 20 nm. Here, the value of LUMO of the anode interface layer was 2.3 eV.

Evaluation Results

In Examples 1 to 7, the above-mentioned organic EL devices were evaluated, and the results are shown in Table 1. Further, the proportion (mass %) of the polymer compound in the anode interface layer and the value of LUMO (eV) in each Example are also shown in Table 1. In the evaluation of the organic EL device, the time until the half luminance (referred to as the lifetime) was measured in a nitrogen atmosphere at 85° C. by 1/64 duty pulse driving (70 Hz, 150 mA/cm$^2$ applied during the selected time, −10 V applied during non-selected time), and evaluation was made by this lifetime length (hours: hr) which is shown in Table 1. Further, as an index for suppressing short circuiting and leakage current, the value of current density during the application of a voltage of −20 V after measuring the lifetime, was measured. This value is shown as the leakage current (mA/cm$^2$) in Table 1. The smaller this value, the smaller the leakage current.

TABLE 1

| Ex. No. | | Proportion of polymer compound (mass %) | LUMO (eV) | Leakage current (mA/cm$^2$) | Lifetime (hr) |
| --- | --- | --- | --- | --- | --- |
| Ex. 1 | Present invention | 67 | 2.3 | $1 \times 10^{-5}$ | 3000 |
| Ex. 2 | Present invention | 67 | 2.3 | $1 \times 10^{-5}$ | 1400 |
| Ex. 3 | Present invention | 67 | 2.3 | $1 \times 10^{-5}$ | 2000 |
| Ex. 4 | Comparative example | 100 | 2.0 | $1 \times 10^{-5}$ | 100 |
| Ex. 5 | Present invention | 33 | 2.4 | $1 \times 10^{-5}$ | 2000 |
| Ex. 6 | Comparative example | 3 | 2.4 | $1 \times 10^{-3}$ | 1000 |
| Ex. 7 | Present invention | 50 | 2.3 | $1 \times 10^{-5}$ | 2000 |

As described in the foregoing, by the present invention, it is possible to present an organic EL device having improved emission characteristics and lifetime characteristics.

The entire disclosure of Japanese Patent Application No. 2002-376280 filed on Dec. 26, 2002 including specification, claims, drawings and summary are incorporated herein by reference in its entirety.

What is claimed is:

1. An organic electroluminescence device comprising
   an anode layer,
   a cathode layer,
   a light-emitting layer present between the anode layer and the cathode layer, and
   a hole transporting thin film layer present between the light-emitting layer and the anode layer, wherein
   the hole transporting thin film layer in contact with the anode layer contains at least 5 mass % of a polymer compound,
   the value of the lowest unoccupied molecular orbit of the hole transporting thin film layer is at least 2.1 eV, and
   the hole transporting thin film layer in contact with the anode layer contains an intermingled mixture of a hole transporting polymer compound and a hole transporting low molecular weight compound.

2. The organic electroluminescence device according to claim 1, wherein the hole transporting low molecular weight compound is a polyarylpolyamine.

3. The organic electroluminescence device according to claim 1, wherein the hole transporting polymer compound is a polymer compound having, on its main chain or side chain, a tertiary nitrogen atom having an aromatic ring bonded thereto.

4. The organic electroluminescence device according to claim 1, wherein the hole transporting polymer compound is a polyvinyl carbazole, or an aromatic condensation polymerized polymer having a repeating unit containing a tertiary nitrogen atom having an aromatic ring bonded thereto.

5. The organic electroluminescence device according to claim 1, wherein the light-emitting layer contains
   a host compound,
   a first guest compound being a compound having a glass transition temperature of at least 100° C. and a hole mobility which is larger than the hole mobility of the host compound, and
   a second guest compound being a compound having a band gap which is smaller than the band gap of the host compound.

6. The organic electroluminescence device according to claim 5, wherein the first guest compound is a polyarylpolyamine.

7. The organic electroluminescence device according to claim 5, wherein the amount of the first guest compound in the light-emitting layer is from 10 to 40 mol % based on the total amount of the host compound, the first guest compound and the second guest compound.

8. The organic electroluminescence device according to claim 5, wherein
   the hole transporting thin film layer in contact with the anode layer contains a hole transporting polymer compound and a hole transporting low molecular weight compound.

9. The organic electroluminescence device according to claim 8, wherein the hole transporting low molecular weight compound is a polyarylpolyamine.

10. The organic electroluminescence device according to claim 8, wherein the hole transporting polymer compound is a polymer compound having, on its main chain or side chain, a tertiary nitrogen atom having an aromatic ring bonded thereto.

11. The organic electroluminescence device according to claim 10, wherein the hole transporting polymer compound is a polyvinyl carbazole, or an aromatic condensation polymerized polymer having a repeating unit containing a tertiary nitrogen atom having an aromatic ring bonded thereto.

12. The organic electroluminescence device according to claim 1, wherein the hole transporting thin film layer in contact with the anode layer contains a uniform mixture of the hole transporting polymer compound and the hole transporting low molecular weight compound.

13. A method of making an organic electroluminescence device, the method comprising
   depositing on a substrate an anode layer, a hole transporting thin film layer, a light-emitting layer, and a cathode layer; and
   producing the device of claim 1.

* * * * *